United States Patent
Wang

(10) Patent No.: US 7,576,580 B2
(45) Date of Patent: Aug. 18, 2009

(54) ENERGY EFFICIENT CLOCK DESKEW SYSTEMS AND METHODS

(75) Inventor: Lei Wang, Holden, MA (US)

(73) Assignee: University of Connecticut, Farmington, CT (US)

( * ) Notice: Subject to any disclaimer, the term of this patent is extended or adjusted under 35 U.S.C. 154(b) by 0 days.

(21) Appl. No.: 11/411,729

(22) Filed: Apr. 26, 2006

(65) Prior Publication Data
US 2007/0013421 A1   Jan. 18, 2007

Related U.S. Application Data

(60) Provisional application No. 60/675,285, filed on Apr. 27, 2005.

(51) Int. Cl.
*H03L 7/00* (2006.01)

(52) U.S. Cl. ..................... 327/161; 327/291

(58) Field of Classification Search ........... None
See application file for complete search history.

(56) References Cited

U.S. PATENT DOCUMENTS

| | | | | | |
|---|---|---|---|---|---|
| 4,458,165 | A | * | 7/1984 | Jackson | 327/276 |
| 4,859,970 | A | * | 8/1989 | Matsuo et al. | 331/57 |
| 5,828,870 | A | * | 10/1998 | Gunadisastra | 713/503 |
| 6,121,906 | A | * | 9/2000 | Kim | 341/100 |
| 6,348,826 | B1 | * | 2/2002 | Mooney et al. | 327/270 |
| 6,374,203 | B1 | * | 4/2002 | Millman et al. | 703/14 |
| 6,504,439 | B1 | * | 1/2003 | Ozawa et al. | 331/57 |
| 6,838,926 | B2 | * | 1/2005 | Jung et al. | 327/525 |
| 6,867,620 | B2 | * | 3/2005 | Singh et al. | 326/121 |
| 6,958,627 | B2 | * | 10/2005 | Singh et al. | 326/93 |
| 6,985,401 | B2 | * | 1/2006 | Jang et al. | 365/233 |
| 6,995,998 | B2 | * | 2/2006 | Kang | 365/145 |
| 7,030,671 | B2 | * | 4/2006 | Park | 327/172 |
| 2004/0257130 | A1 | * | 12/2004 | Cafaro et al. | 327/141 |

OTHER PUBLICATIONS

Fetzer, et al., "The Multi-Threaded, Parity Protected 128 Word Register Files on a Dual-Core Itanium®-Family Processor," 2005 IEEE International Solid-State Circuits Conference, pp. 382-383.
Tam et al., "Clock Generation and Distribution for the First IA-64 Microprocessor," IEEE J. Solid-State Circuits, vol. 35, No. 11, pp. 1545-1552, Nov. 2000.
Berkeley Predictive Technology Model, URL: http://www-device.eecs.berkeley.edu/~ptm, 2005.
Cao, et al., "New Paradigm of Predictive MOSFET and Interconnect Modeling for Early Circuit Design," Proc. of IEEE CICC, pp. 201-204, Jun. 2000.
The International Technology Roadmap for Semiconductors: 2003 Edition, URL: http:public.itrs.net/Files/2003ITRS/Home2003.htm].

* cited by examiner

*Primary Examiner*—Cassandra Cox
(74) *Attorney, Agent, or Firm*—McCarter & English, LLP

(57) ABSTRACT

Systems and methods for active clock deskew are provided. The disclosed systems/methods advantageously achieve desirable clock deskew at reduced power levels by employing a resistance-based distributed clock deskew technique. The disclosed technique has broad commercial/industrial applicability, e.g., in VLSI/ULSI chips, such as microprocessors, digital signal processing systems (DSPs), integrated circuits, application-specific integrated circuits (ASICs), micro-controllers, embedded systems, memory chips and the like.

14 Claims, 4 Drawing Sheets

ENERGY EFFICIENT CLOCK DESKEW SYSTEMS AND METHODS

CROSS-REFERENCE TO RELATED APPLICATIONS

The present application claims the benefit of a provisional patent application entitled "Energy Efficient Clock Deskew Systems and Methods," which was filed on Apr. 27, 2005, and assigned Ser. No. 60/675,285. The entire contents of the foregoing provisional patent application are incorporated herein by reference.

BACKGROUND

1. Technical Field

The present disclosure is directed to systems and methods for active clock deskew and, more particularly, to systems and methods for achieving desirable clock deskew at reduced power levels. The disclosed systems/methods employ a resistance-based distributed clock deskew technique that has broad commercial/industrial applicability, e.g., in VLSI/ULSI chips, such as microprocessors, digital signal processing systems (DSPs), integrated circuits, application-specific integrated circuits (ASICs), micro-controllers, embedded systems, memory chips and the like.

2. Background Art

Semiconductor technology scaling enables tremendous advances in developing high-speed, very large scale integration (VLSI) chips. However, with semiconductor technology being scaled into smaller feature sizes, timing noise such as clock skew is exacerbated by the growing chip complexity. Timing noise/clock skew is caused by increasingly large process variations. Large process variations imply and/or translate to less control of device parameters and result in large uncertainty in clock propagation delay.

As used herein, clock skew is defined as the difference in time between simultaneous clock transitions within a VLSI chip (or other processor). There are several factors that contribute to clock skew. Increased levels of chip complexity generally require clock signals to be distributed across large die area and to drive huge load capacitance. Due to such factors, clock signals are more likely subject to design mismatches. In state-of-the-art microprocessors, clock skew is consuming a large percent of the total cycle time, thereby limiting the microprocessor to logic computations for only part of the total cycle time. Clock skew as a fraction of the ever shrinking cycle time is expected to increase as technology is scaled further. This directly affects the maximum achievable performance, reliability, and power dissipation in a variety of applications, e.g., high-performance synchronous VLSI/ULSI chips.

The 2003 International Technology Roadmap for Semiconductor (ITRS) has identified design robustness as one of the "Grand Challenges" in the next decade. Clock skew is a critical factor that may ultimately determine the design robustness in future VLSI chips. Consistent with the importance of clock skew to performance, clock deskew techniques have been developed for high-performance VLSI design. The basic prior art approach to clock deskew involves intentional introduction of time delay in the opposite direction of clock skew, on different clock distribution paths, to offset any skew on these paths. Existing approaches achieve clock deskew by introducing additional capacitance into VLSI chips. However, the dynamic power dissipation of a VLSI chip, which is the dominant power component, is a linearly increasing function of chip capacitance. As a result, the existing clock deskew circuits incur large power overheads because clock signals switch the added capacitance constantly, thereby significantly increasing total chip power dissipation and severely affecting chip performance.

Clock deskew techniques have been effective in practice and have been applied extensively in high-performance VLSI chips. While the existing clock deskew techniques are effective in minimizing clock skew, the power dissipation incurred by these techniques is significant. In state-of-the-art microprocessors, a large percent of total chip power is contributed to clock generation and the associated distribution network. Power dissipation associated with the clock network is moving in an unmanageable direction, requiring enhanced techniques to control increasingly severe clock skew issues. Indeed, the combination of clock skew and clock-related power consumption challenge the very foundation of the low power and cost benefits of VLSI chips.

Accordingly, a need exists for clock deskew systems and methods that reduce and control clock skew, while requiring reduced levels of power consumption. These and other objects are satisfied by the systems and methods disclosed herein.

SUMMARY OF THE DISCLOSURE

The present disclosure provides advantageous systems and methods that employ resistance-based skew compensation techniques or variable delay circuit techniques for active clock deskew. In comparison with existing power-consuming clock deskew techniques, the disclosed systems and methods require low power consumption while effectively reducing and/or controlling clock skew. Thus, the disclosed systems and methods offer significant commercial and/or operational advantages relative to existing deskew techniques. Indeed, the disclosed systems/methods have the potential for replacing existing clock deskew techniques, e.g., in high-performance VLSI/ULSI chips.

The resistance-based skew compensation or variable delay circuit technique of the present disclosure advantageously generates different time delays by changing the resistance of resistors connected serially on a clock signal. According to exemplary embodiments, a pass transistor can be modeled as a resistor after being turned on. A chain of pass transistors can thus be considered as a set of resistors connected in series. These resistors can generate copies of the same signal but with different time delay. A pass transistor can also be modeled as a switch if the size of the pass transistor is large enough so that the resistance of the equivalent resistor is much smaller after being turned on. Control signals can be programmed so as to obtain different values of time delay.

In comparison with existing techniques, the presently disclosed systems and methods employ resistance-based skew compensation or variable delay circuit technique to effectively minimize clock skew without incurring large power overhead. The disclosed technique changes delay time—which is determined by the product of resistance and capacitance (i.e., RC)—by using or effecting additional resistance (R). Because the dynamic power dissipation of VLSI chips is a linear function of capacitance C, but is not directly effected or dependent on chip resistance, power overhead due to the additional resistance associated with the disclosed clock deskew systems/methods is reduced and much smaller than conventional deskew techniques.

Low or reduced power consumption is a significant advantage of the disclosed resistance-based skew compensation or variable delay circuit technique. As noted above, existing clock deskew techniques incur large power overheads and thus are not ideal for high-performance VLSI/ULSI chips. The power consumption of a high-performance microprocessor is currently in the range of several hundred watts and is expected to increase in future VLSI chips. A low-power clock design is essential to maintain and support continued VLSI developments. The disclosed resistance-based skew compensation or variable delay circuit technique is thus advantageous for at least the following reasons: (i) the technique can effectively minimize clock skew without incurring large power overheads, (ii) the technique is practical and can be applied directly in various VLSI chips, such as microprocessors, DSPs, communications ICs, ASICs, and memory chips, and (iii) a multitude of industrial/commercial applications stand to benefit from adoption of the disclosed technique.

Moreover, the disclosed resistance-based skew compensation or variable delay circuit technique has better scalability than existing clock deskew techniques. Scalability is a much-needed attribute for integrated circuit techniques and it is common in the semiconductor industry that new VLSI chips are largely leveraged from current VLSI chips by scaling the designs to an advanced semiconductor technology with minimal effort/cost associated with the scaling/redesign. Thus, designers would prefer to use in current designs a circuit technique that can potentially work well in future designs. To offset the increasingly large clock skew in future designs, the existing clock deskew techniques require increases in load capacitance, implying larger overheads in power and area in future VLSI chips. In contrast, the disclosed resistance-based skew compensation or variable delay circuit technique increases resistance to offset increasingly large clock skew, which can be achieved, e.g., by reducing the size of pass gates, thereby reducing overheads of power and area.

In short, the systems and methods of the present disclosure provide energy-efficient skew compensation techniques having wide range applicability and offering significant benefits. Additional features and functions of the disclosed systems and methods will be apparent from the detailed description which follows, particularly when read in conjunction with the appended figures.

BRIEF DESCRIPTION OF THE APPENDED FIGURES

To assist those of ordinary skill in the operation and use of the disclosed systems and methods for skew compensation, reference is made to the appended figures, wherein.

DESCRIPTION OF EXEMPLARY EMBODIMENT(S)

The present disclosure is directed to advantageous systems and methods for effecting energy-efficient skew compensation. The disclosed systems/methods utilize resistance-based distributed clock deskew or variable delay circuit techniques. As compared to prior art clock deskew techniques, the disclosed systems/methods achieve significant power reduction while maintaining effective skew management. In addition, the disclosed systems/methods are advantageously scalable, such that future technologies and/or processor developments may effectively utilize the disclosed deskew techniques despite increased timing noise and reduced reliability margins.

For purposes of the present disclosure, timing noise may be defined as the disturbance in delay between simultaneous clock transitions at different sequential elements. There are generally two major sources of timing noise: (i) skew, and (ii) jitter. Skew is generally caused by systematic mismatch, whereas jitter is generally caused by cycle-to-cycle variation. Both sources of timing noise are generally time-varying and have a significant impact on system performance and reliability. In addition, signals passing through combinational logic components may have different delays at a receiver, e.g., based on different propagation delays, voltage shift and/or coupling effects. The composite effect of these delay variables creates a set of complex constraints on the timing of synchronous integrated circuits. The presence of clock skew effectively shortens the cycle time and, when compounded by signal delay variation, increases the chance of timing failures and complicates clock design.

Figure 1:
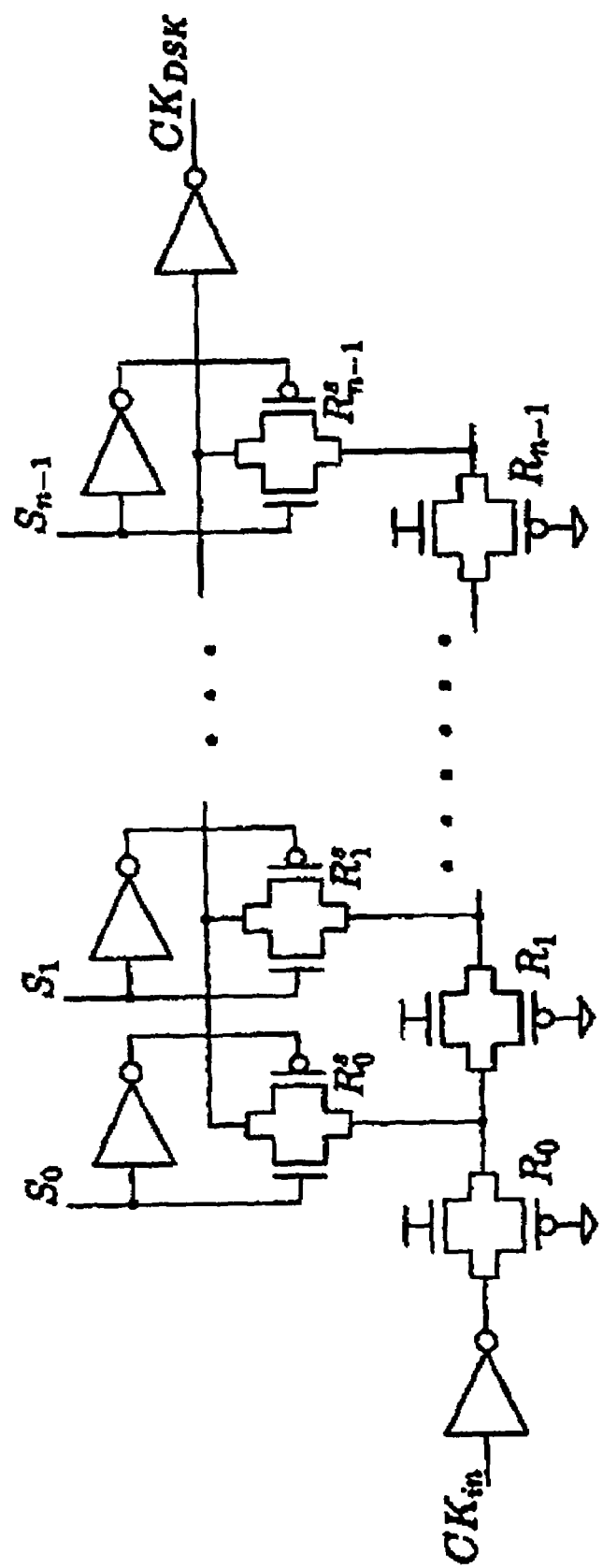
FIG. 1 is a schematic circuit diagram for an exemplary skew compensation system according to the present disclosure.

According to the present disclosure, resistance-based distributed clock deskew techniques are provided that effect, permit and/or facilitate energy-efficient skew compensation. With reference to FIG. 1, a schematic circuit diagram is provided reflecting an exemplary implementation of a resistance-based distributed clock deskew technique according to the present disclosure. The circuit topology consists of serially connected transmission gates (TGs) and a set of control TGs that can be selectively turned on by the signal $\underline{S}=[S_0, S_1, \ldots, S_{n-1}]$. It is noted that the equivalent resistance of a TG changes within a relatively small range as the input switches. Thus, the TGs can be modeled and/or viewed as a series of resistors whose values are determined by the size of nMOS and pMOS transistors. Accordingly, if the $i^{th}$ control TG is on, i.e., $S_i=1$, $S_j=0$, for $j \neq i$, then the output clock signal is sampled from the $i^{th}$ node of the TGs. For purposes of the exemplary circuit set forth in FIG. 1, the nodes contain different copies of the input clock signal with incremental delays from the input end to the output end. Delay adjustment can be accomplished by shifting a "1" to the output end to increase the delay, or by shifting a "1" to the input end to decrease delay. The input and output inverters are typically sized to drive a specific load range and control the edge rate of the output clock signal, as will be apparent to persons skilled in the art.

As noted above, prior art clock deskew techniques manipulate the RC delay of a clock signal by introducing additional capacitance. The added capacitance is switched by clock signals at every clock cycle. This could potentially lead to large power overheads, especially in future technology generations where sophisticated clock deskew techniques are needed to control the increasingly large clock skew. In comparison, the resistance-based distributed clock deskew technique of the present disclosure manages clock skew by distributing resistive loads to generate clock signals with variable delay. This provides an energy-efficient alternative, mainly because the parasitic capacitance introduced is much smaller.

The performance/operation of the disclosed resistance-based distributed clock deskew technique in specific implementations thereof is controlled by design parameters, such as step size, the number of control bits, and delay adjustment ranges. These design parameters are generally optimized with respect to applicable performance trade-offs to achieve effective skew compensation in a particular implementation of the disclosed resistance-based distributed clock deskew technique.

In assessing performance/operation of the disclosed resistance-based distributed clock deskew technique and/or making design determinations with respect thereto, the following quantitative analysis is useful. Step size ($\tau_s$) defines the minimum value of clock skew that can be removed by the resistance-based distributed clock deskew technique, i.e., it determines and/or defines the resolution of skew compensation. It is noted that the TG delay chain contains copies of input clock signal with incremental delays. The delay of the clock sample at the $i^{th\ node}$ can be approximated as:

$$\tau_i = \left( \sum_{j=0}^{i} R_j + R_i^s \right) C_{load} \tag{1}$$

where $R_i$ and $R_i^s$ are the equivalent resistances of the $i^{th}$ TG and its control TG, respectively, and $C_{load}$ is the lumped capacitance that is primarily comprised of interconnect capacitance, the diffusion capacitance of the TGs, and the gate capacitance of the output inverter. To the first order of approximation, $C_{load}$ may be considered to be a constant. It is noted that the TGs may be implemented with the same size for design simplicity, i.e., $R_0 = R_1 = \ldots R_{n-1} \triangleq R_{load}$ and $R^s_0 = R^s_1 = \ldots R^s_{n-1} \triangleq R_{control}$, where $R_{load} \gg R_{control}$. However, the present disclosure is not limited to implementations wherein the TGs are the same size.

From the relationship set forth in equation (1) above, the step size $\tau_s$ can be derived as follows:

$$\tau_s = \tau_{i+1} - \tau_i \tag{2}$$
$$= R_{load} C_{load}$$

As shown in equation (2), the step size $\tau_s$ is a function of $R_{load}$, which is determined by the size of the TGs. Accordingly, a small step size permits the fine-tuning of clock delay, resulting in small residual skew once the circuit resolves to a stable position. However, an increase in the length of the TG delay chain is generally required to cover a given range of skew (see equation (3) below). In addition, a small step size may cause the circuit to become sensitive to jitter and could potentially cause false adjustment(s).

The delay adjustment range ($\tau_r$) may be used to quantify the maximum amount of skew that the resistance-based distributed clock deskew technique of the present disclosure can effectively handle. The delay adjustment range is a function of the number of control bits (n) and the step size ($\tau_s$), i.e., $$\tau_r = n\tau_s \tag{3}$$

According to the present disclosure, the delay adjustment range ($\tau_r$) is typically chosen to cover the skew budget for the system design, such as:

$$\tau_r \geq \tau_s^{lead} + \tau_s^{lag}, \tag{4}$$

where $\tau_s^{lead}$ and $\tau_s^{lag}$ are given by the following formulae (5) and (6), respectively:

$$t_s^{lead} \leq T_c - (t_d^{max} + t_R^{setup}), \tag{5}$$

where $t_s^{lead}$ is the leading skew on clock $ck_k$, $T_c$ is the clock period, and $t_R^{setup}$ is the setup time requirement of register $R_k$; and $$t_s^{lag} < t_d^{min} - t_R^{hold}, \tag{6}$$

where $t_s^{lag}$ is the lagging skew on clock $ck_k$ and $t_R^{hold}$ is the hold time requirement of register $R_k$. The signal arrives at register $R_k$ at $[t_d^{min}, t_d^{max}]$. The values of $\tau_s^{lead}$ and $\tau_s^{lag}$ can be obtained by system-level timing analysis that takes into account variations of process parameters, supply voltages, temperature as well as other design mismatches.

Figure 2:
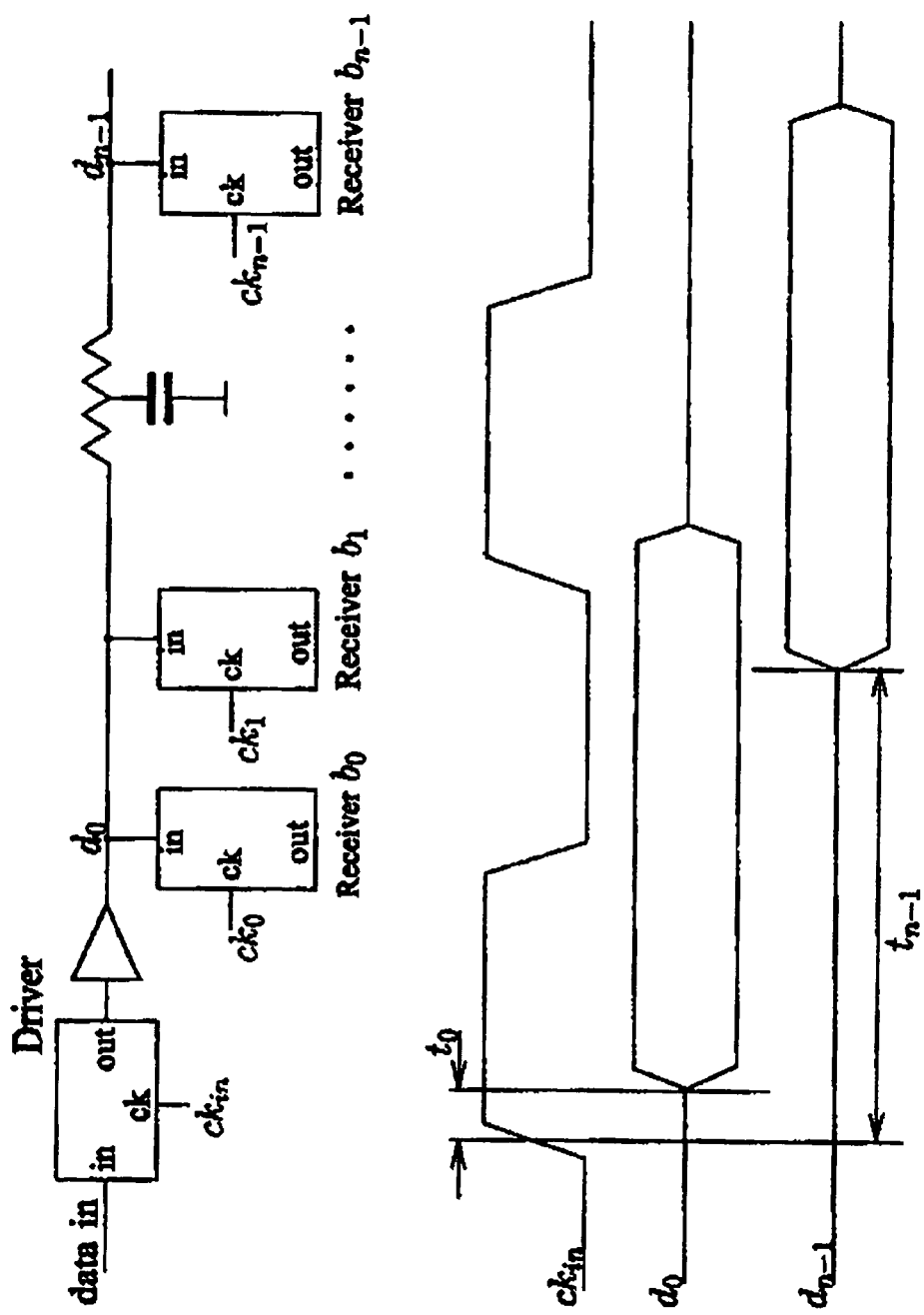
FIG. 2 is an exemplary schematic circuit and timing diagram for a clock skew compensation system in an on-chip communication system with distributed receivers.

The performance of the disclosed resistance-based distributed clock deskew technique is highly advantageous. For illustrative purposes, clock deskew performance is evaluated in the context of a high-speed on-chip communication system with distributed receivers. Skew management is critical to this system due to RC delay dispersion on interconnect wires. FIG. 2 illustrates an exemplary on-chip communication system where a number of receivers are distributed along with interconnect wires that span multiple regions. This structure can be found in many integrated systems, e.g., the decoder block of a memory array where address bits need to be connected to different memory entries [E. Fetzer, Lei Wang, and J. Jones, "The multi-threaded, parity protected 128 word register files on a dual-core Itanium® Family Processor," 2005 International Solid-state Circuits Conference, pp. 382-383]. Obviously, the near-end receiver $b_0$ receives signals with the smallest RC delay, whereas the far-end receiver $b_{n-1}$ receives the same signals, but experiences the largest RC delay. Consequently, the signal arrival times $t_0$ and $t_{n-1}$ at the two ends are significantly different. On the other hand, the clock signals $ck_0, ck_1, \ldots, ck_{n-1}$ might be routed across different clock domains in a multi-level clock hierarchy, and therefore are subject to substantial clock skew. The combination of clock skew and delay dispersion makes setup time constraint (5) a serious issue at the far-end receivers and hold time constraint (6) a serious issue at the near-end receivers.

Conventional techniques to tackle the hold time problem involve adding delays to signals at the near end that are sensitive to hold time failures. This approach, however, exacerbates the setup time problem at the far end. Likewise, the same set of signals needs to be made faster to meet the setup time requirement at the far end. This in turn makes the hold time problem worse at the near end. The actual skew budget and potential timing failures depend on different applications. For the purpose of illustration, it may be concluded that the near-end receiver $b_0$ fails on hold time while the far-end receiver $b_{n-1}$ fails on setup time. These failures are typical in many integrated systems. The disclosed resistance-based distributed clock deskew technique may be advantageously employed to deskew clock signals to solve this complicated setup/hold timing problem at the two ends.

Figure 3:
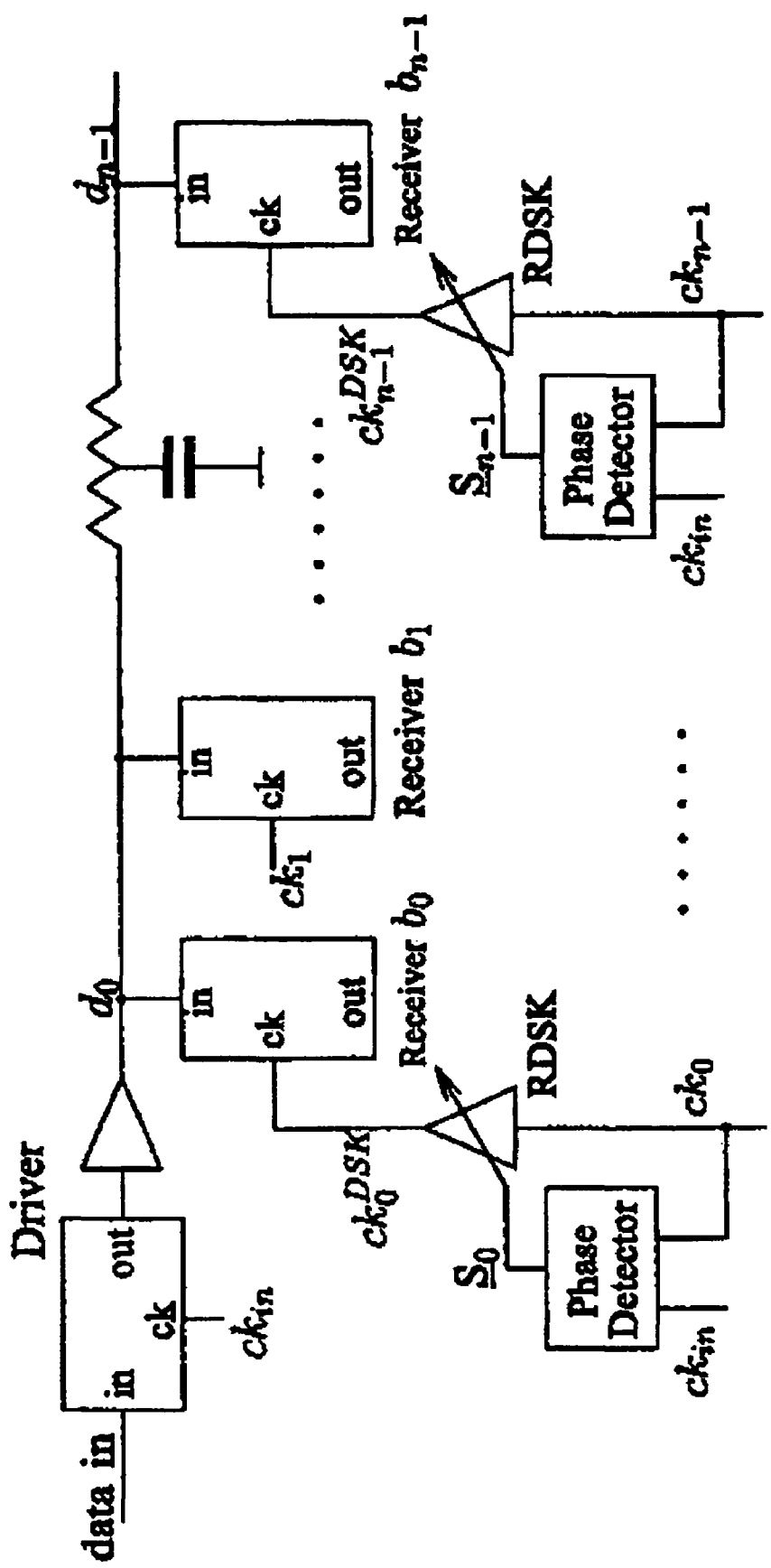
FIG. 3 is a schematic circuit diagram reflecting clock deskew according to an exemplary embodiment of the present disclosure.

As shown in FIG. 3, phase detectors (R-S latches) are employed to detect phase difference between two clocks and update the control signal correspondingly to achieve skew compensation. [Tam et al., "Clock generation and distribution for the first IA-64 microprocessor," *IEEE J. Solid-State Circuits*, Vol. 35, No. 11, pp. 1545-1552, November 2000 (the "Tam Publication")]. This scheme can be utilized to monitor skew variation in real-time and adjust performance adaptively in response to time-varying noise.

For illustrative purposes, an exemplary resistance-based distributed clock deskew system was designed into a 0.10 µm BPTM CMOS process [Berkeley Predictive Technology Model, URL: http://www-device.eecs.berkeley.edu/~ptm; Cao et al., "New paradigm of predictive MOSFET and interconnect modeling for early circuit design," *Proc. of IEEE CICC*, pp. 201-204, June 2000]. The on-chip communication system operates at 2.0 GHz clock frequency with a skew budget accounting for 12% of the total cycle time in accordance with the trends predicted by ITRS [see, The International Technology Roadmap for Semiconductors: 2003 Edition, URL: http:public.itrs.net/Files/2003ITRS/Home2003.htm]. The resistance-based distributed clock deskew system was designed with the step size $\tau_s$=6 ps and the delay adjustment range $\tau_r$=60 ps. This required a 10-stage TG delay chain.

Figure 4:
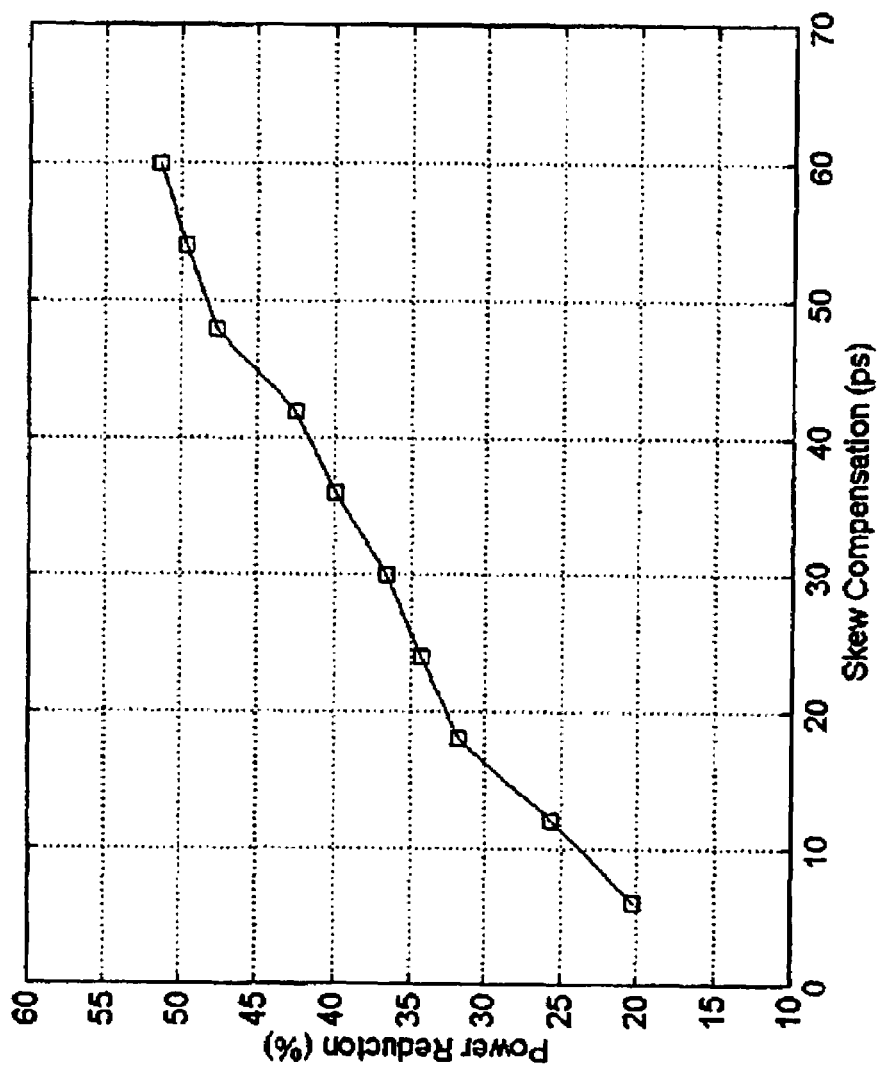
FIG. 4 is a performance plot associated with performance of an exemplary skew compensation system according to the present disclosure.

FIG. 4 compares the performance of the disclosed resistance-based distributed clock deskew system and the existing clock deskew technique described in the Tam Publication. Of primary interest is the capacitive power dissipation, which is the dominant power component in clock deskew circuits. The parasitic capacitance, including interconnect capacitance, was estimated and included in the simulations. As shown in FIG. 4, the power reduction achieved by the disclosed resistance-based distributed clock deskew technique ranges from 20% at 6 ps skew compensation to 51% at 60 ps skew compensation. This superior performance may be explained by the fact that the resistance-based distributed clock deskew technique of the present disclosure introduces much smaller parasitic capacitance across the skew compensation range. In contrast, the existing technique disclosed in the Tam Publication uses additional capacitance to offset large skew, thereby inducing substantial power overheads.

As demonstrated by the power reduction results plotted in FIG. 4, the disclosed resistance-based distributed clock deskew technique is effective to reduce power consumption, while simultaneously providing effective skew compensation. The disclosed clock deskew technique may be advantageously employed in a variety of applications with comparable advantages. In addition, the disclosed resistance-based distributed clock deskew technique is highly scalable.

Scalability is of significant importance. As noted previously, it has been predicted in the International Technology Roadmap for Semiconductors that clock skew and jitter will continue to increase from 12% of the cycle time in 0.10 μm process to 40% in 45 nm process. To tackle the increasingly large clock skew in future technology generations, the existing techniques would need to increase the deskew capacitance in proportion, implying a trend towards larger overheads in power and area. In contrast, the disclosed resistance-based distributed clock deskew technique is able to achieve skew management by utilizing large resistance. This in general can be achieved by reducing the size of TGs, thereby translating to a reduction in power and area overheads. Accordingly, the disclosed resistance-based distributed clock deskew technique exhibits better scalability relative to existing capacitive-based clock deskew techniques for future technology scaling.

In sum, the present disclosure provides a resistance-based distributed clock deskew technique for achieving energy-efficient skew compensation. The disclosed resistance-based distributed clock deskew technique achieves significant power reduction while effectively delivering desired levels of skew management. Simulation results of an on-chip interconnect communication system implemented in a 0.10 μm process demonstrated 20%-50% power reduction over a 60 ps delay adjustment range. The disclosed resistance-based distributed clock deskew technique also provides better scalability over existing clock deskew techniques. While the present disclosure discloses exemplary embodiments and/or implementations of the advantageous resistance-based deskew techniques, the present disclosure is not limited to such exemplary embodiments/implementations. Rather, the present disclosure is susceptible to modifications, alterations and/or enhancements without departing from the spirit or scope thereof, and the present disclosure expressly encompasses such modifications, alterations and/or enhancements to the disclosed resistance-based deskew techniques, as will be readily apparent to persons skilled in the art.

The invention claimed is:

1. A clock deskew system, comprising:
a transmission circuit including resistance-based means for effecting clock deskew associated with the transmission circuit, said resistance-based means including distributed resistive loads to generate clock signals with variable delay, said transmission circuit including: (i) serially connected transmission gates defining an input end and an output end, wherein the serially connected transmission gates are adapted to receive an input clock signal at the input end, and (ii) a plurality of control transmission gates in communication with the transmission circuit associated with transmission of the input clock signal from the input end to the output end, and
wherein each of the plurality of control transmission gates is adapted to receive a control signal,
wherein a selected control transmission gate is turned on by delivery of a control signal thereto;
wherein an output clock signal is sampled from a node associated with the selected control transmission gate, thereby controlling clock skew through resistance variation associated, at least in part, through delivery of the control signal to the selected control transmission gate and sampling of the output clock signal from the node associated therewith;
wherein the node associated with each control transmission gate contains a different copy of the input clock signal;
wherein the copy of the input clock signal at a given control transmission gate demonstrates incremental delay moving from the input end to the output end; and
wherein delay adjustment of the clock signal is accomplished by shifting the control signal from a first control transmission gate to a second control transmission gate.

2. A system according to claim 1, wherein each control transmission gate is characterized by an equivalent resistance, and wherein the equivalent resistance changes within a small range based on delivery of a control signal thereto.

3. A system according to claim 1, wherein each transmission gate is modeled as a resistor for determination of clock skew control.

4. A system according to claim 3, wherein each transmission gate includes one or more nMOS and pMOS transistors, and wherein the modeled resistor value is based, at least in part, on the size of the nMOS and pMOS transistors.

5. A system according to claim 1, wherein an increased delay is accomplished by shifting the control signal toward the output end.

6. A system according to claim 1, wherein a decreased delay is accomplished by shifting the control signal toward the input end.

7. A system according to claim 1, wherein the transmission circuit includes an input inverter and an output inverter.

8. A system according to claim 1, wherein clock skew control is determined through a control parameter selected from the group consisting of step size, number of control bits, delay adjustment ranges, and combinations thereof.

9. A system according to claim 1, wherein the selected control transmission gate demonstrates clock signal delay and wherein the clock signal delay is characterized by:

$$\tau_i = \left(\sum_{j=0}^{i} R_j + R_i^s\right) C_{load}$$

where $R_i$ and $R_i^s$ are equivalent resistances for the selected control transmission gate and an associated control transmission gate from the serially connected transmission gates, respectively, and $C_{load}$ is a lumped capacitance value that includes interconnect capacitance, diffusion capacitance of the transmission gates, and gate capacitance of an output inverter associated with the selected control transmission gate.

10. A system according to claim 1, wherein the resistance-based means for effecting clock deskew is effective to reduce power consumption levels over a delay adjustment range.

11. A system according to claim 1, wherein the serially connected transmission gates and control transmission gates are incorporated into an application selected from the group consisting of a VLSI chip, a ULSI chip, a microprocessor, a digital signal processing system, an integrated circuit, an application-specific integrated circuit (ASIC), a micro-controller, an embedded system, and a memory chip.

12. A clock deskew system, comprising:
a transmission circuit including resistance-based means for effecting clock deskew associated with the transmission circuit, said resistance-based means including distributed resistive loads to generate clock signals with variable delay, said transmission circuit including: (i) serially connected transmission gates defining an input end and an output end, wherein the serially connected transmission gates are adapted to receive an input clock signal at the input end, and (ii) a plurality of control transmission gates in communication with the transmission circuit associated with transmission of the input clock signal from the input end to the output end;
wherein each of the plurality of control transmission gates is adapted to receive a control signal;
wherein a selected control transmission gate is turned on by delivery of a control signal thereto;
wherein an output clock signal is sampled from a node associated with the selected control transmission gate, thereby controlling clock skew through resistance variation associated, at least in part, through delivery of the control signal to the selected control transmission gate and sampling of the output clock signal from the node associated therewith;
wherein the transmission circuit includes an input inverter and an output inverter; and
wherein the input inverter and the output inverter are sized to drive a load range and control edge rate of the output clock signal.

13. A system according to claim 12, wherein each control transmission gate defines a node, and wherein the node associated with each control transmission gate contains a different copy of the input clock signal.

14. A system according to claim 13, wherein the copy of the input clock signal at a given control transmission gate demonstrates incremental delay moving from the input end to the output end.

* * * * *